US012810911B2

(12) United States Patent
Yamane et al.

(10) Patent No.: US 12,810,911 B2
(45) Date of Patent: Nov. 24, 2026

(54) SEMICONDUCTOR DEVICE AND MEMORY MODULE

(71) Applicant: Renesas Electronics Corporation, Tokyo (JP)

(72) Inventors: Kazunori Yamane, Tokyo (JP); Takanori Akashige, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 133 days.

(21) Appl. No.: 18/788,898

(22) Filed: Jul. 30, 2024

(65) Prior Publication Data

US 2025/0149075 A1 May 8, 2025

(30) Foreign Application Priority Data

Nov. 2, 2023 (JP) ................................ 2023-188107

(51) Int. Cl.
*G11C 11/00* (2006.01)
*G11C 7/10* (2006.01)
*G11C 7/22* (2006.01)

(52) U.S. Cl.
CPC ............ *G11C 7/222* (2013.01); *G11C 7/1069* (2013.01); *G11C 7/1087* (2013.01)

(58) Field of Classification Search
CPC ...... G11C 7/222; G11C 7/1069; G11C 7/1087
See application file for complete search history.

(56) References Cited

U.S. PATENT DOCUMENTS 9,368,174 B2 * 6/2016 Nishio ................ G11C 11/4076
11,626,867 B2 * 4/2023 Okinoi .................. H03K 5/135 327/161
2007/0176658 A1 * 8/2007 Ishikawa .................. H03L 7/07 327/161

OTHER PUBLICATIONS

"DDR5 Data Buffer Definition (DDR5DB01)-Rev1.1", JESD82-521, JEDEC Solid State Technology Association, Dec. 2021, p. 17 (256 pages).

* cited by examiner

*Primary Examiner* — Pho M Luu
(74) *Attorney, Agent, or Firm* — Rimon P.C.

(57) ABSTRACT

To provide a semiconductor device and a memory module capable of correctly maintaining the phase relationship between a data signal and a data strobe signal that determines the latch timing of the data signal. A variable delay circuit VDLYs_A generates respective data strobe signals DQSin, DQSin_M by delaying an input data strobe signal MDQS by delay amounts ST1, ST2. A timing adjustment circuit TMCT adjusts the delay amount ST1 based on the determination of matching/mismatching between a data signal DQo from a main slicer SLr and a data signal DQo_M from a monitor slicer SLr_M, while changing the delay amount ST2.

13 Claims, 15 Drawing Sheets

SEMICONDUCTOR DEVICE AND MEMORY MODULE

CROSS-REFERENCE TO RELATED APPLICATIONS

The disclosure of Japanese Patent Application No. 2023-188107 filed on Nov. 2, 2023, including the specification, drawings and abstract is incorporated herein by reference in its entirety.

BACKGROUND

The present invention relates to semiconductor devices and memory modules, for example, semiconductor devices such as data buffers mounted on memory modules.

There are disclosed techniques listed below.

[Non-Patent Document 1] "DDR5 Data Buffer Definition (DDR5DB01)—Rev1.1", JESD82-521, JEDEC SOLID STATE TECHNOLOGY ASSOCIATION, December 2021, p. 17

Non-Patent Document 1 defines the standard specifications for DDR5 data buffers for driving DQ and DQS signals in DDR5 LRDIMM applications, specifically, specifications related to parameters and testing of DC and AC interfaces.

SUMMARY

For example, in systems such as cloud and enterprise, high-speed memory modules such as DDR5 (Double Data Rate 5) LRDIMM (Load Reduced Dual Inline Memory Module) are used. As shown in Non-Patent Document 1, such memory modules are equipped with a data buffer for driving data signal (DQ signal) and data strobe signals (DQS signal). The data buffer includes a data retention circuit called a slicer, which latches the input DQ signal at the edge of the DOS signal. The data buffer adjusts the phase of the DQS signal using a variable delay circuit, for example, in an initial sequence, to ensure such latching operation.

On the other hand, in the data buffer, for example, a decision feedback equalizer (DFE) or the like, which enhances signal quality, may be inserted in the transmission path of the input DQ signal. For example, the delay time of the DEE changes according to changes in the environment such as temperature and voltage. As a result, even if the phase of the DOS signal is adjusted by the initial sequence, the phase of the DQ signal may change according to changes in the environment, potentially failing to correctly maintain the phase relationship between the DQ signal and the DQS signal.

The embodiment described later is made in view of such matters, and other problems and novel features will become apparent from the description of this specification and the accompanying drawings.

A semiconductor device according to one embodiment includes a first and a second data retention circuits, a variable delay circuit, and a timing adjustment circuit. The first data retention circuit latches an input data signal in synchronization with a first data strobe signal. The second data retention circuit latches the input data signal in synchronization with a second data strobe signal. The variable delay circuit generates the first and second data strobe signals by delaying the input data strobe signal by a first delay amount and a second delay amount, respectively. The timing adjustment circuit adjusts the first delay amount based on the determination result by determining the match/mismatch between the first data signal from the first data retention circuit and the second data signal from the second data retention circuit while changing the second delay amount.

According to one embodiment, it is possible to correctly maintain the phase relationship between the data signal and the data strobe signal that defines the latching timing of the data signal.

DETAILED DESCRIPTION

Figure 1:
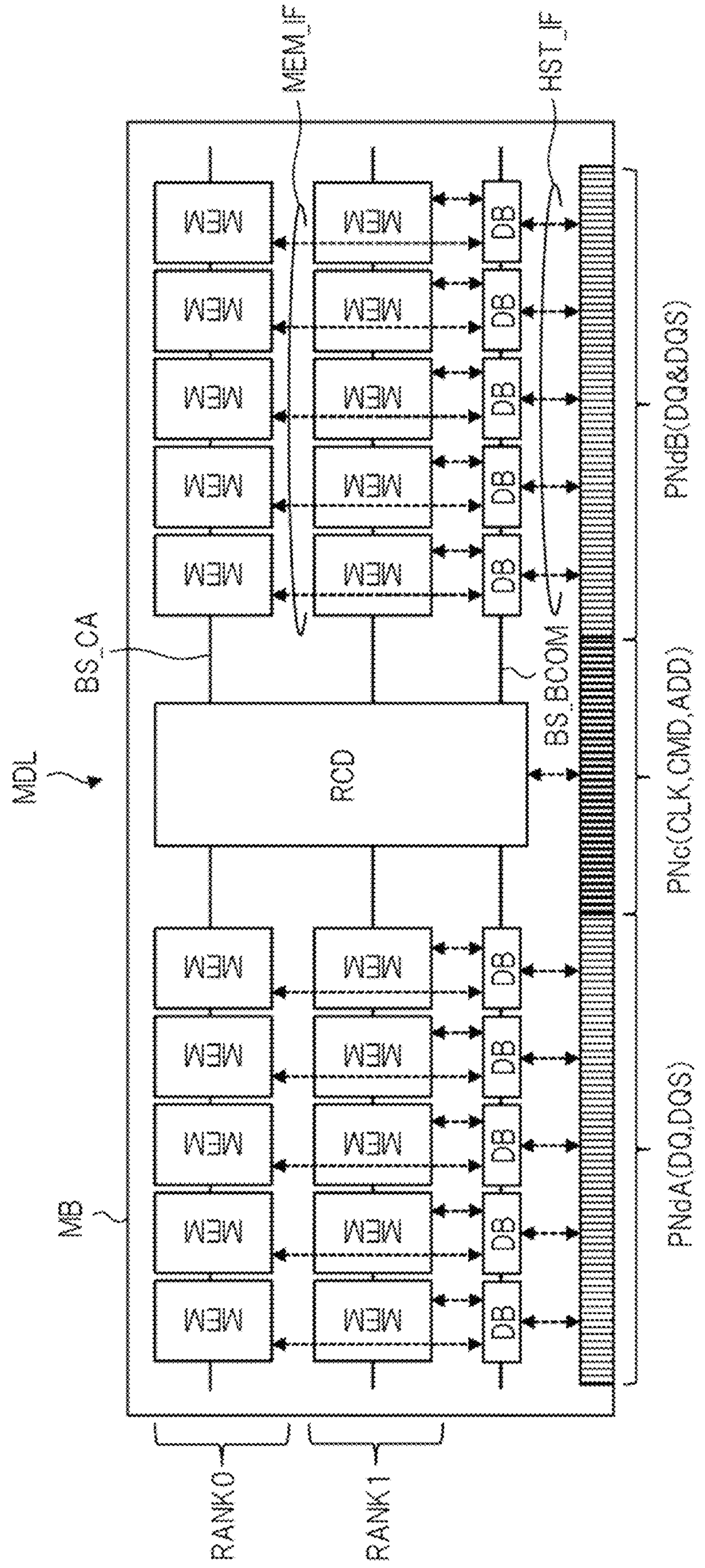
FIG. 1 is a schematic diagram showing a configuration example of a memory module according to a first embodiment.

In the following embodiments, for convenience, when necessary, they are described by dividing into multiple sections or embodiments. Except when specifically indicated, these are not unrelated to each other; one may be a part or all of a modified example, detail, supplementary explanation, etc., of the other. Furthermore, in the following embodiments, when referring to the number of elements, etc. (including the number of elements, numerical values, quantities, ranges, etc.), except when specifically indicated and when it is clearly limited to a specific number in principle, it is not limited to that specific number and may be more or less than the specific number.

Moreover, in the following embodiments, it goes without saying that the constituent elements (including element steps and the like) are not necessarily essential, except in cases where they are specifically indicated and in cases where they are considered to be obviously essential in principle. Similarly, in the following embodiments, when referring to the shapes, positional relationships, etc., of components and the like, it is assumed to include those that are substantially approximate to or similar to the shapes, etc., except in cases where they are specifically indicated and in cases where they are considered not to be so in principle. This applies to the above numerical values and ranges as well.

Furthermore, the circuit elements constituting each functional block of the embodiments are not particularly limited but are formed on a semiconductor substrate such as single-crystal silicon by integrated circuit technology known as CMOS (Complementary MOS transistors), among others.

Hereinafter, embodiments are described in detail with reference to the drawings. In all the drawings for explaining the embodiments, members having the same functions are denoted by the same reference numerals, and repetitive descriptions thereof are omitted. Moreover, in the following embodiments, descriptions of the same or similar parts will not be repeated in principle except when particularly necessary.

First Embodiment

<Schematic Operation of Memory Module>

FIG. 1 is a schematic diagram showing a configuration example of a memory module according to the first embodiment. The memory module MDL shown in FIG. 1 is, for example, an LRDIMM. The memory module MDL includes a module wiring substrate MB, a plurality of memory chips MEM mounted on the module wiring substrate MB, a plurality of data buffers DB, and a registered clock driver RCD.

Moreover, the module wiring substrate MB is equipped with a plurality of external terminals. The plurality of external terminals include control external terminals PNc and data external terminals PNdA, PNdB. The control external terminals PNC are input terminals for memory control signals such as a clock signal CLK, a command signal CMD, and an address signal ADD. The data external terminals PNdA, PNdB are input/output terminals for a data signal DQ and a data strobe signal DQS.

The registered clock driver RCD is, for example, composed of a single semiconductor chip. The registered clock driver RCD re-drives the memory control signals input via the control external terminals PNc and outputs them to the plurality of memory chips MDL via the CA bus BS_CA. Furthermore, the registered clock driver RCD generates buffer control signals for the data buffers DB based on the input memory control signals and outputs them to the plurality of data buffers DB via the BCOM bus BS_BCOM.

Each of the plurality of data buffers DB, for example, is composed of a single semiconductor chip. The plurality of data buffers DB identifies the write period and the read period for the memory chip MEM based on the buffer control signal from the Registered Clock Driver RCD. During the write period, the plurality of data buffers DB re-drive the data signal DQ and the data strobe signal DQS inputted through the external terminals for data PNdA, PNdB, and output them to the plurality of memory chips MEM. During the read period, the plurality of data buffers DB re-drive the data signal DQ and the data strobe signal DOS from the plurality of memory chips MEM, and output them to the external terminals for data PNdA, PNdB.

Each of the plurality of memory chips MEM is, for example, a DDR-SDRAM chip, specifically such as a DDR5-SDRAM chip. Each memory chip MEM performs a write operation or a read operation in response to the memory control signal from the CA bus BS_CA. During the write operation, each memory chip MEM takes in the data signal DQ from the data buffer DB using the data strobe signal DQS and writes it to the selected memory cell. During the read operation, each memory chip MEM outputs the data signal DQ read from the selected memory cell, along with the data strobe signal DQS, to the data buffer DB.

A host provided outside the memory module MDL inputs and outputs "2×m" bits of data signal DQ, which are inputted and outputted by the data buffer DB, through the m-bit data terminals included in the external terminals for data PNdA, PNdB. At this time, the host inputs and outputs m bits of data signal DQ in half the clock cycle "(½) Tck" based on twice the clock frequency "2×fck", and inputs and outputs m bits of data signal DQ in the following half clock cycle. The Registered Clock Driver RCD and the plurality of data buffers DB absorb the speed difference between such memory interface MEM_IF and host interface HST_IF by buffering.

Figure 2:
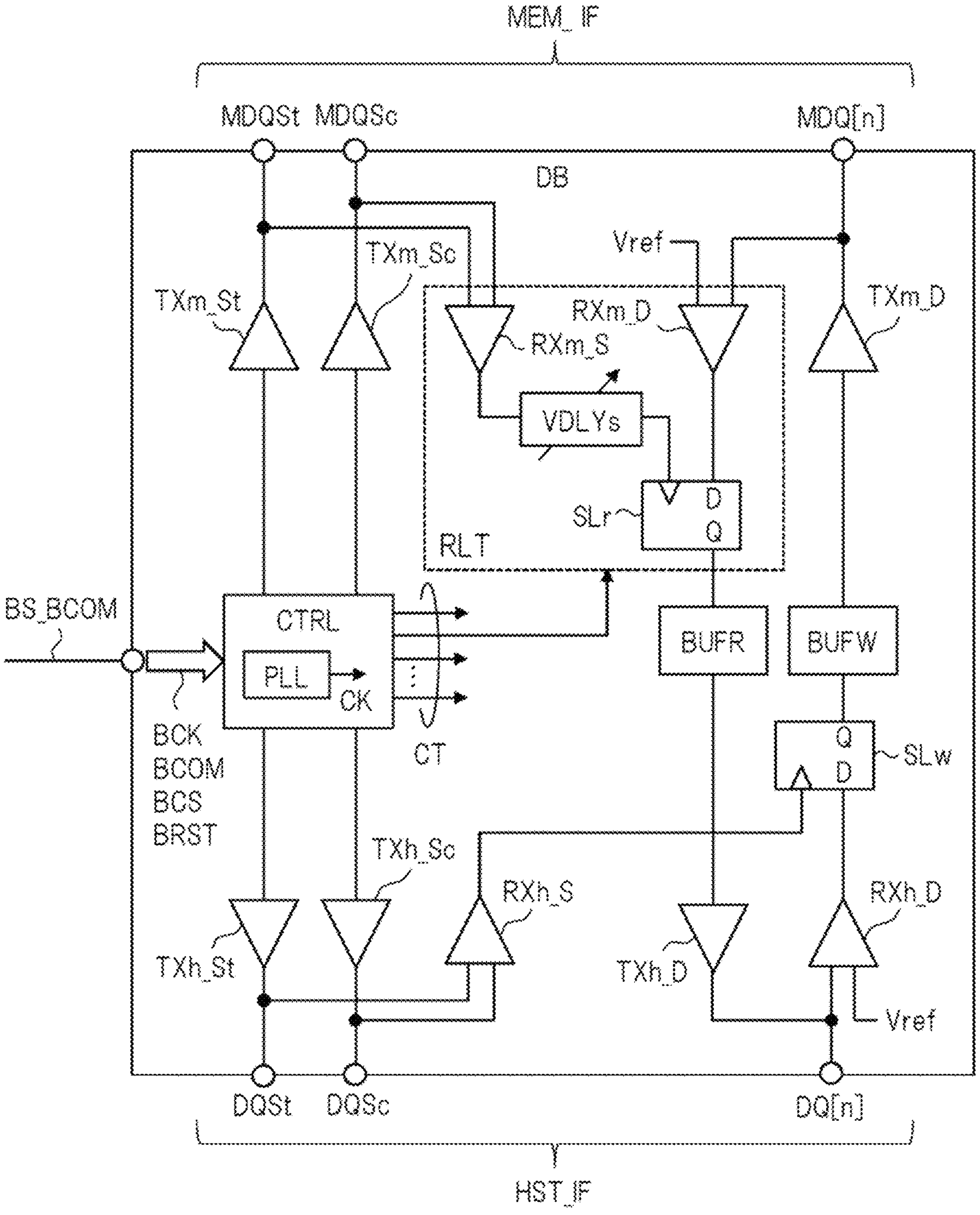
FIG. 2 is a circuit block diagram showing a schematic configuration example of a main part of a data buffer in FIG. 1.

FIG. 2 is a circuit block diagram showing a schematic configuration example of the main part of the data buffer DB in FIG. 1. For simplicity of explanation, a configuration example focusing on a 1-bit data signal DQ is shown. The data buffer DB shown in FIG. 2 includes drivers TXh_St, TXh_Sc, TXh_D, receivers RXh_S, RXh_D, and a slicer SLw provided on the host interface HST_IF side. Furthermore, the data buffer DB includes drivers TXm_St, TXm_Sc, TXm_D, and a read latch circuit RIT provided on the memory interface MEM_IF side. Additionally, the data buffer DB includes a buffer control circuit CTRL, a read buffer BUFR, and a write buffer BUFW.

The drivers TXh_St, TXh_Sc output complementary data strobe signals DQSt, DQSc to the host interface HST_IF side. Receiver RXh_S differentially inputs the complementary data strobe signals DQSt, DQSc from the host interface HST_IF side and outputs a clock signal for latching to the slicer SLw. The driver TXh_D outputs data from the read buffer BUFR as data signals DQ[n] to the host interface HST_IF side.

The receiver RXh_D differentially inputs the data signal DQ[n] from the host interface HST_IF side and a pre-generated reference voltage Vref, and outputs the data signal DQ[n] to the slicer SLw. The slicer SLw is composed of flip-flops, among other components. The slicer SLw latches the data signal DQ[n] from the receiver RXh_D in synchronization with the clock signal from the receiver RXh_S.

Meanwhile, the drivers TXm_St, TXm_Sc output complementary data strobe signals MDQSt, MDQSc to the memory interface MEM_IF side. The read latch circuit RET includes receivers RXm_S, RXm_D, a variable delay circuit VDLYs, and a slicer SLr. The receiver RXm_S differentially inputs the complementary data strobe signals MDQSt, MDQSc from the memory interface MEM_IF side and outputs a clock signal for latching to the variable delay circuit VDLYs. The variable delay circuit VDLYs delays the inputted clock signal and outputs it to the slicer SLr.

The receiver RXm_D differentially inputs the data signal MDQ[n] from the memory interface MEM_IF side and a pre-generated reference voltage Vref, and outputs the data signal MDQ[n] to the slicer SLr. The slicer SLr is a data holding circuit composed of flip-flops, among other components. The slicer SLr latches the data signal MDQ[n] from the receiver RXm_D in synchronization with the clock signal from the variable delay circuit VDLYs.

Each of the read buffer BUFR and the write buffer BUFW is composed of, for example, FIFO (First In First Out) buffers. The read buffer BUFR stores the data signal MDQ [n] from the slicer SLr on the memory interface MEM_IF side. Then, the read buffer BUFR outputs the stored data signal MDQ[n] as data signal DQ[n] to the host interface HST_IF side through the driver TXh_D.

Meanwhile, the write buffer BUFW stores the data signal DQ[n] from the slicer SLw on the host interface HST_IF side. Then, the write buffer BUFW outputs the stored data signal DQ[n] as data signal MDQ[n] to the memory interface MEM_IF side through the driver TXm_D.

The buffer control circuit CTRL inputs a buffer control signal from the BCOM bus BS_BCOM and outputs an internal control signal CT for controlling each part within the data buffer DB based on the buffer control signal. The buffer control signal includes, for example, a clock signal BCK, a command signal BCOM, a chip selects signal BCS, and a reset signal BRST. The internal control signal CT includes, for example, an enable signal to drivers and receivers, input and output clocks to the read buffer BUFR and the write buffer BUFW, and a setting value for the delay amount to the variable delay circuits VDLYs.

Furthermore, the buffer control circuit CTRL includes a phase-locked loop (PLD). The phase-locked loop (PLD) generates a new clock signal CK synchronized with the input clock signal BCK. Using the generated clock signal CK, the buffer control circuit CTRL produces complementary data strobe signals MDQSt, MDQSc for the memory interface MEM_IF side, and complementary data strobe signals DQSt, DQSc for the host interface HST_IF side.

<Configuration and Operation Related to the Read Latch Circuit (Comparative Example)>

Figure 10A:
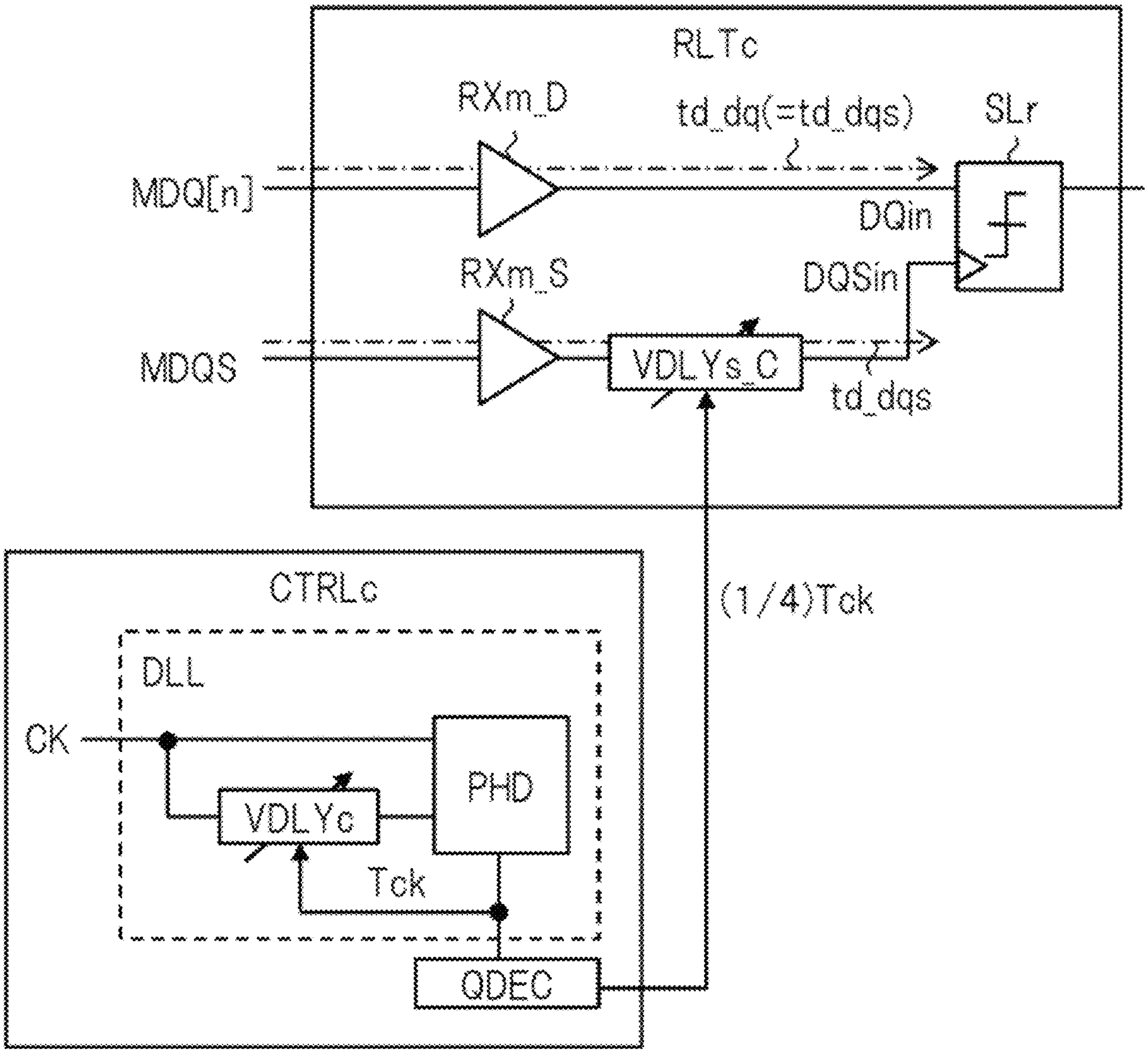
FIG. 10A is a circuit block diagram showing a schematic configuration example of a read latch circuit related to the data buffer shown in FIG. 2 as a first comparative example.
Figure 10B:
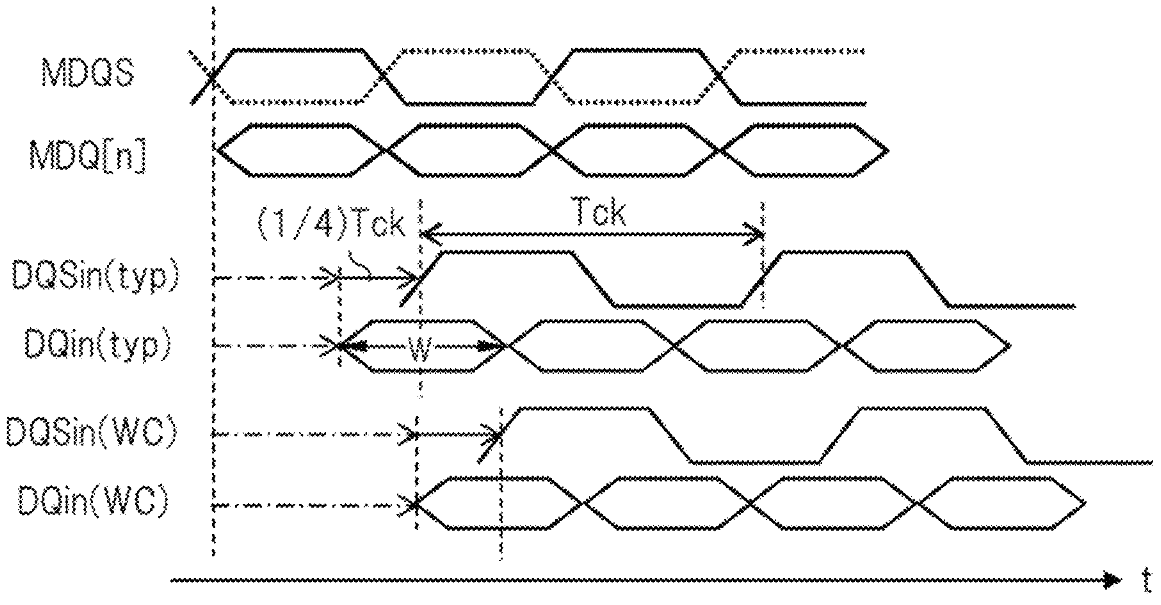
FIG. 10B is a timing chart showing an operation example of the read latch circuit related to FIG. 10A.

FIG. 10A is a circuit block diagram showing a schematic configuration example related to the read latch circuit RLTc, which is a first comparative example, in the data buffer DB shown in FIG. 2. FIG. 10B is a timing chart showing an operation example related to the read latch circuit RLTc shown in FIG. 10A. The read latch circuit RLTc shown in FIG. 10A includes receivers RXm_D, RXm_S, a variable delay circuit VDLYs_C, and a slicer SLr, similar to the case of FIG. 2.

Moreover, the buffer control circuit CTRLc shown in FIG. 10A includes, for example, a delay-locked loop (DLL). The delay-locked loop (DLL) includes a variable delay circuit VDLYc, a phase comparator PHD; and a decoder QDEC. The phase comparator PHD searches for the delay amount of the variable delay circuit VDLYc so that the phase of the clock signal CK from the phase-locked loop (PLL) matches the phase of the clock signal delayed by the variable delay circuit VDLYc. As a result, the delay amount is determined by the period “Tck” of the clock signal CK.

The decoder QDEC sets the value “(¼) Tck”, which is one-quarter of the delay amount “Ick”, in the variable delay circuit VDLYs_C within the read latch circuit RLTc. As a result, the data strobe signal MDQS from the receiver RXm_S is input to the slicer SLr as the data strobe signal DQSin after a delay time of “(¼) Tck”. The slicer SLr latches the data signal DQin from the receiver RXm_D in synchronization with the data strobe signal DQSin.

Specifically, as shown in FIG. 10B, first, the phase of the data signal MDQ[n] output from the memory chip MEM and the phase of the data strobe signal MDQS are matched. Furthermore, the delay time td_dq in the transmission path of the data signal MDQ[n] and the delay time td_dqs in the transmission path of the data strobe signal MDQS are adjusted in advance to be equivalent.

The delay time td_dq is the delay time from the output terminal of the memory chip MEM to the data input node of the slicer SLr, including the delay time by the receiver RXm_D and the delay time by the wiring of the transmission path. Similarly, the delay time td_dqs is the delay time from the output terminal of the memory chip MEM to the clock input node of the slicer SLr, including the delay time by the receiver RXm_S and the delay time by the wiring of the transmission path.

Therefore, by adding the delay time of “(¼) Tck” from the decoder QDEC to the delay time td_dqs with the variable delay circuit VDLYs_C, it is possible to set the edge timing of the data strobe signal DQSin in the middle of the eye width W of the data signal DQin at the input node of the slicer SLr. FIG. 10B shows the state of the data strobe signal DQSin and the data signal DQin in the typical case (typ) and the worst case (WC).

The worst case (WC) refers to, for example, the case where the delay time changes the most in response to changes in the environment such as temperature and voltage. Since the receivers RXm_D, RXm_S are usually composed of similar circuits, the delay times by each receiver RXm_D, RXm_S are equivalent even when the environment changes. Therefore, even in the worst case (WC), it is possible to set the edge timing of the data strobe signal DQSin in the middle of the eye width W of the data signal DQin.

Figure 11A:
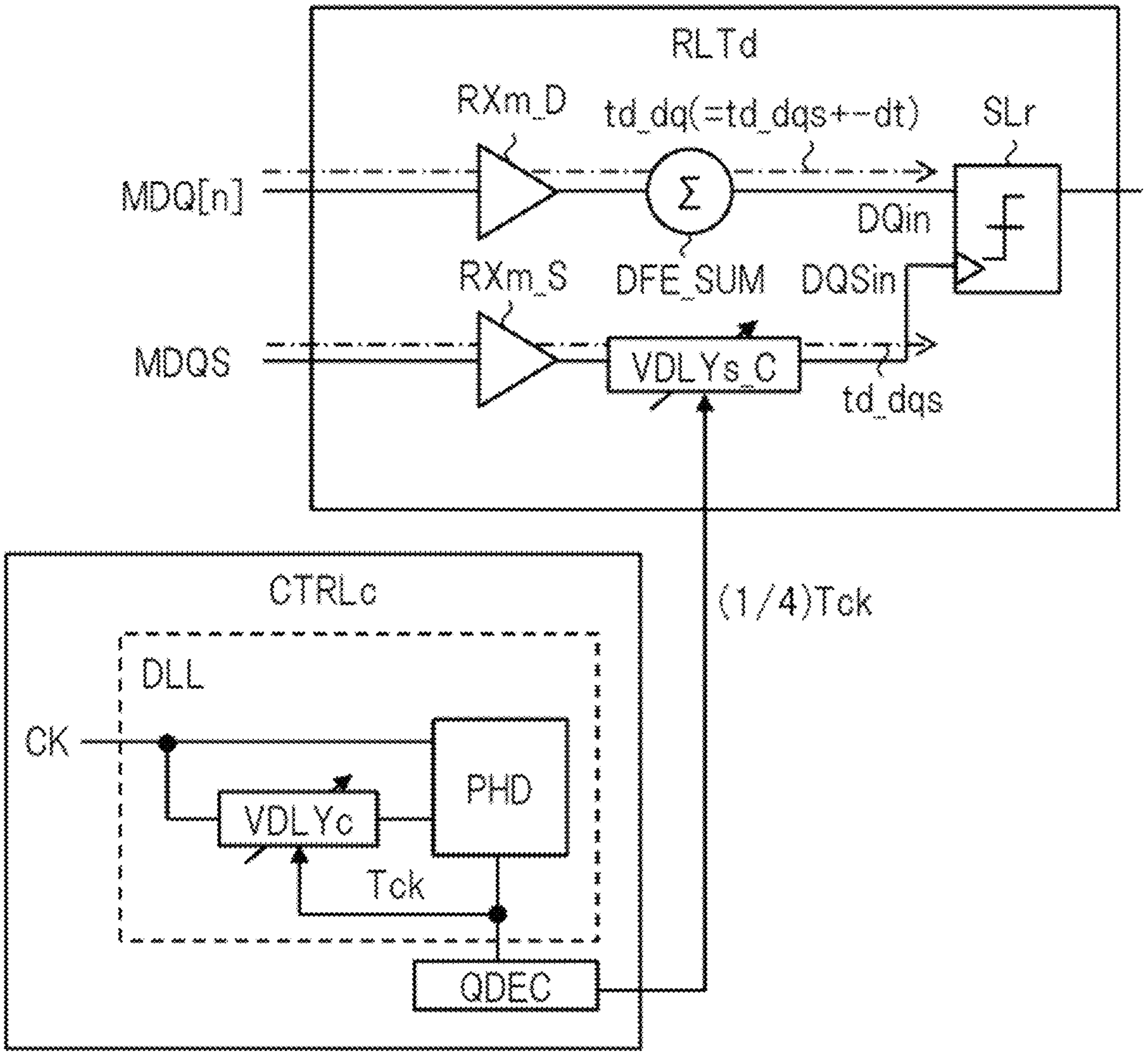
FIG. 11A is a circuit block diagram showing a schematic configuration example of a read latch circuit related to the data buffer shown in FIG. 2 as a second comparative example.
Figure 11B:
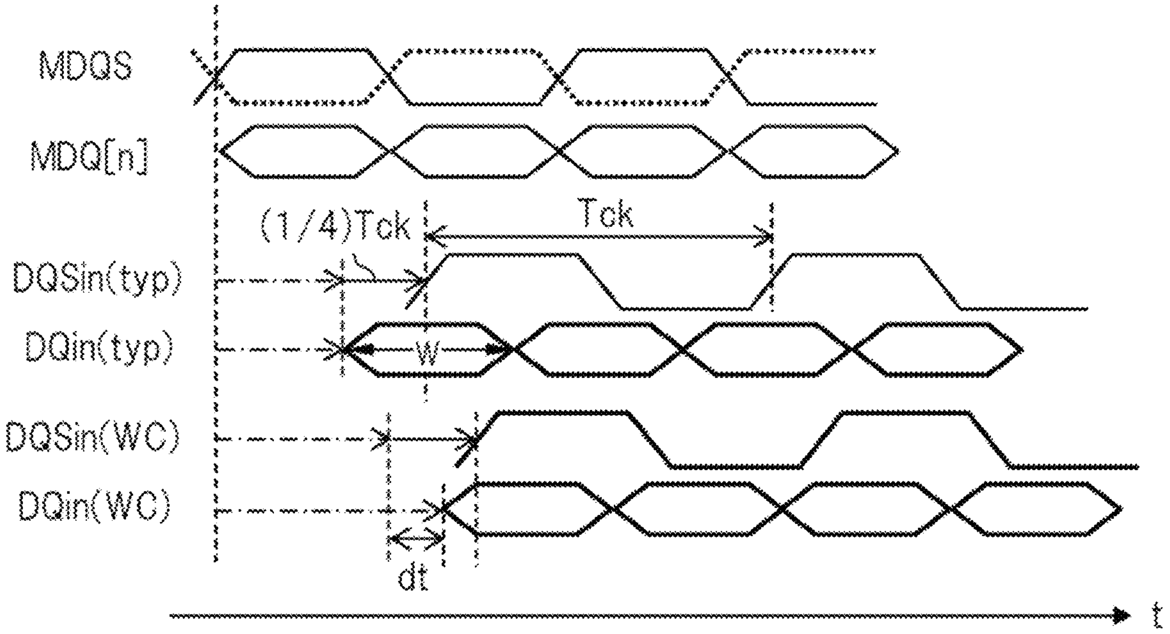
FIG. 11B is a timing chart showing an operation example of the read latch circuit related to FIG. 11A.

FIG. 11A is a circuit block diagram showing a schematic configuration example related to the read latch circuit RLTd as a second comparative example in the data buffer DB shown in FIG. 2. FIG. 11B is a timing chart showing an operation example related to the read latch circuit RLTd shown in FIG. 11A. The read latch circuit RLTd shown in FIG. 11A includes an adder-subtractor DFE_SUM, which is a component of the Decision Feedback Equalizer (DFE), added compared to the configuration example shown in FIG. 10A. The adder-subtractor DFE_SUM is inserted into the wiring between the receiver RXm_D and the slicer SLr. Regarding the buffer control circuit CTRLc, it is the same as in the case of FIG. 10A.

For example, as shown in FIG. 1, when using a 2-rank configuration to widen the bandwidth of the memory, the power consumption increases compared to the case of a 1-rank configuration. To suppress the increase in power consumption, it is sufficient to increase the impedance of the transmission path between the memory chip MEM and the data buffer DB. Specifically, for example, it is sufficient to increase the resistance value of the termination resistor in the transmission path and reduce the signal amplitude in the transmission path.

However, in this case, the signal quality in the transmission path may deteriorate. Therefore, in the example shown in FIG. 11A, a Decision Feedback Equalizer (DFE) is provided to compensate for the deterioration of signal quality. The Decision Feedback Equalizer (DFE) is provided not only for the purpose of compensating for such side effects associated with low power consumption but also for the purpose of compensating for the deterioration of signal quality due to the increase in data transfer speed.

However, when a Decision Feedback Equalizer (DFE) is provided, as shown in FIG. 11B, unlike the case of FIG. 10B, it may not be possible to correctly maintain the phase relationship between the data signal DQin and the data strobe signal DQSin. To explain in detail, first, the delay time td_dq in the transmission path of the data signal MDQ[n] and the delay time td_dqs in the transmission path of the data strobe signal MDQS are set to equivalent values, for example, by properly setting the initial value of the variable delay circuit VDLYs_C during the training period in the initial sequence. This state corresponds to the typical case (typ).

On the other hand, the adder-subtractor DFE_SUM is composed of an analog circuit. Therefore, the delay time caused by the adder-subtractor DFE_SUM may change by time "dt" according to changes in the environment such as temperature and voltage. Consequently, time "dt" is added or subtracted only to the delay time td_dq. As a result, as shown in the worst case (WC), the phase relationship between the data signal DQin and the data strobe signal DQSin changes, and the slicer SLr may not be able to correctly latch the data signal DQin with the data strobe signal DQSin.

In such cases, for example, it is possible to return to a state similar to the typical case (typ) by re-setting the initial value of the variable delay circuit VDLYs_C through re-training. Specifically, for example, it is advisable to perform training periodically, taking into account changes in the environment. However, performing training periodically will reduce the operating time of the system for the duration of the training. Therefore, it is beneficial to use the method of the embodiment described below, <Configuration Related to the Readout Latch Circuit (Embodiment)>

Figure 3:
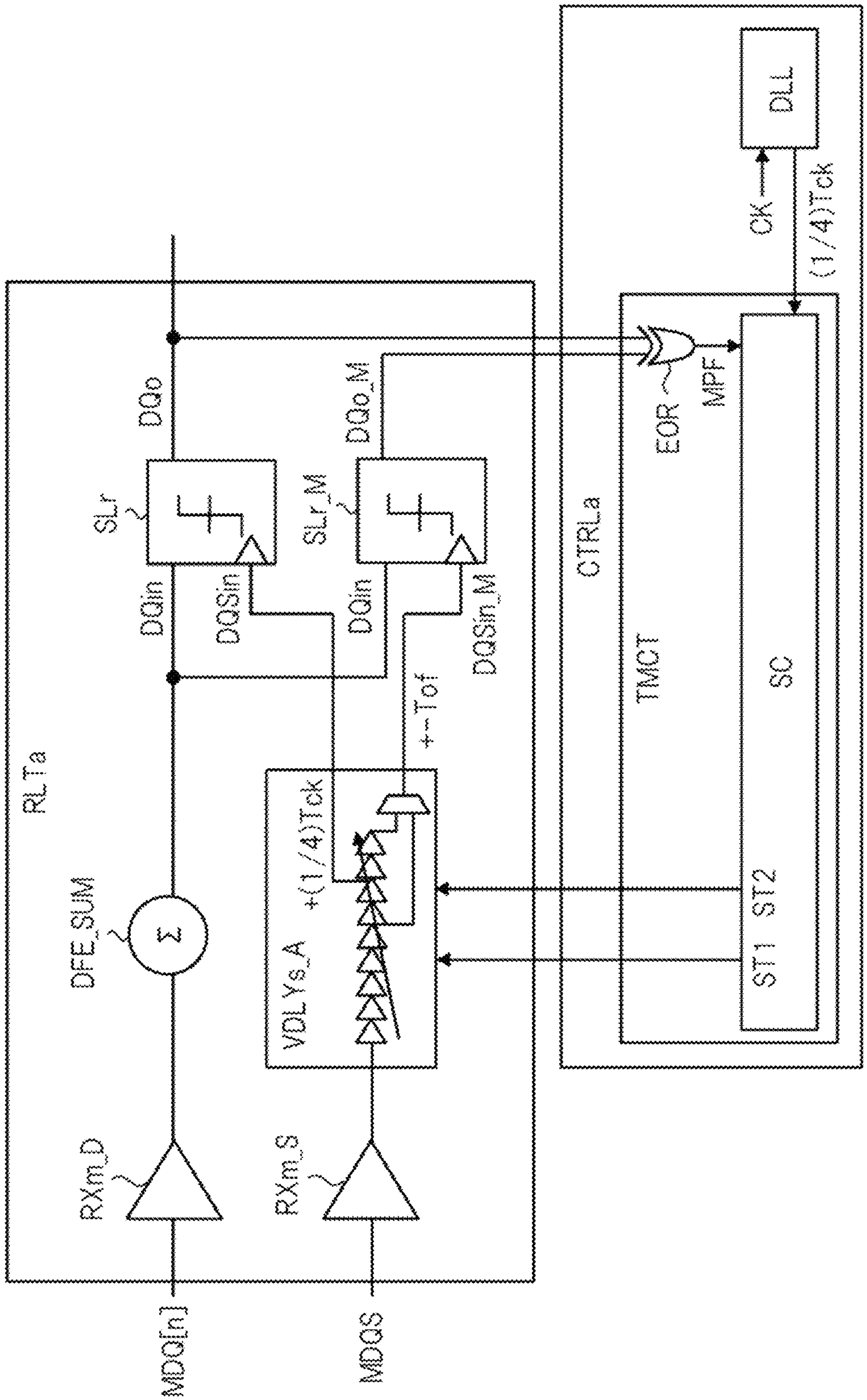
FIG. 3 is a circuit block diagram showing a schematic configuration example of a read latch circuit related to the data buffer shown in FIG. 2 according to the first embodiment.
Figure 4:
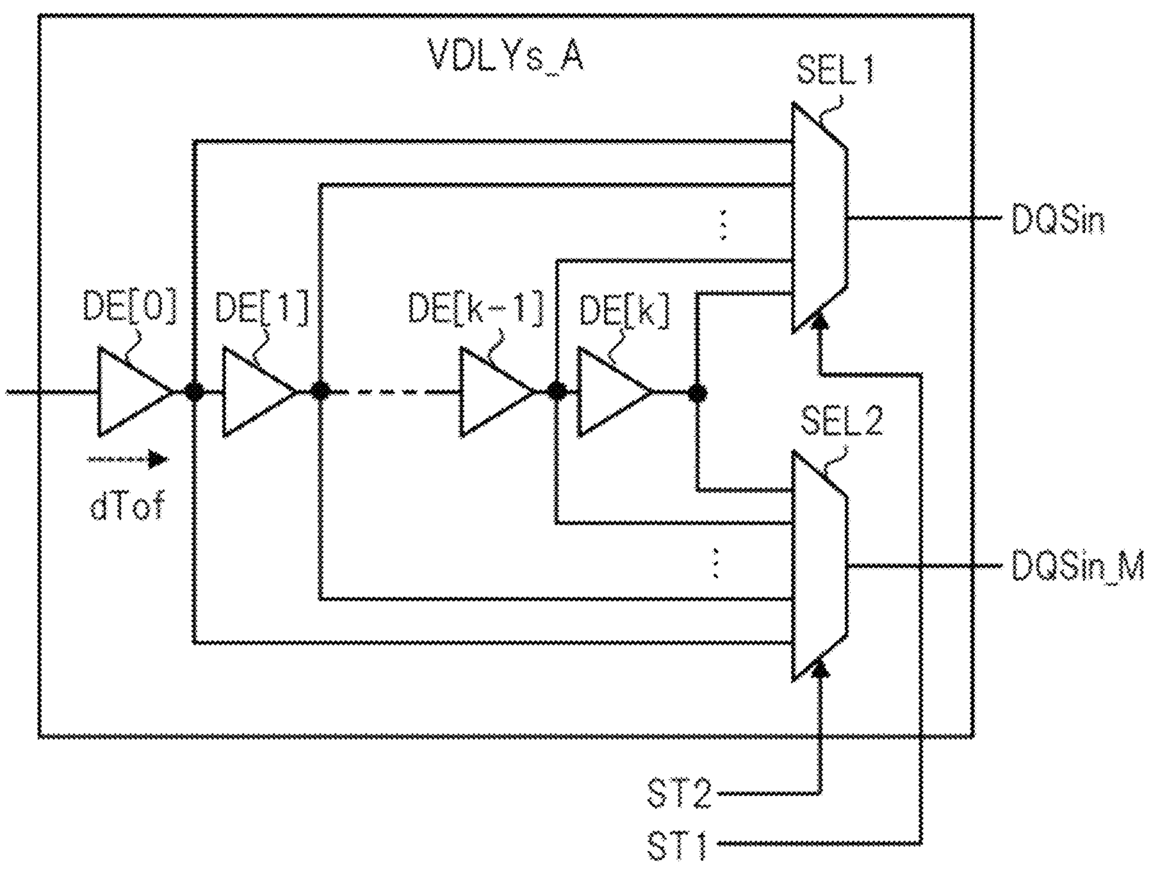
FIG. 4 is a circuit block diagram showing a configuration example of a variable delay circuit in FIG. 3.
Figure 5:
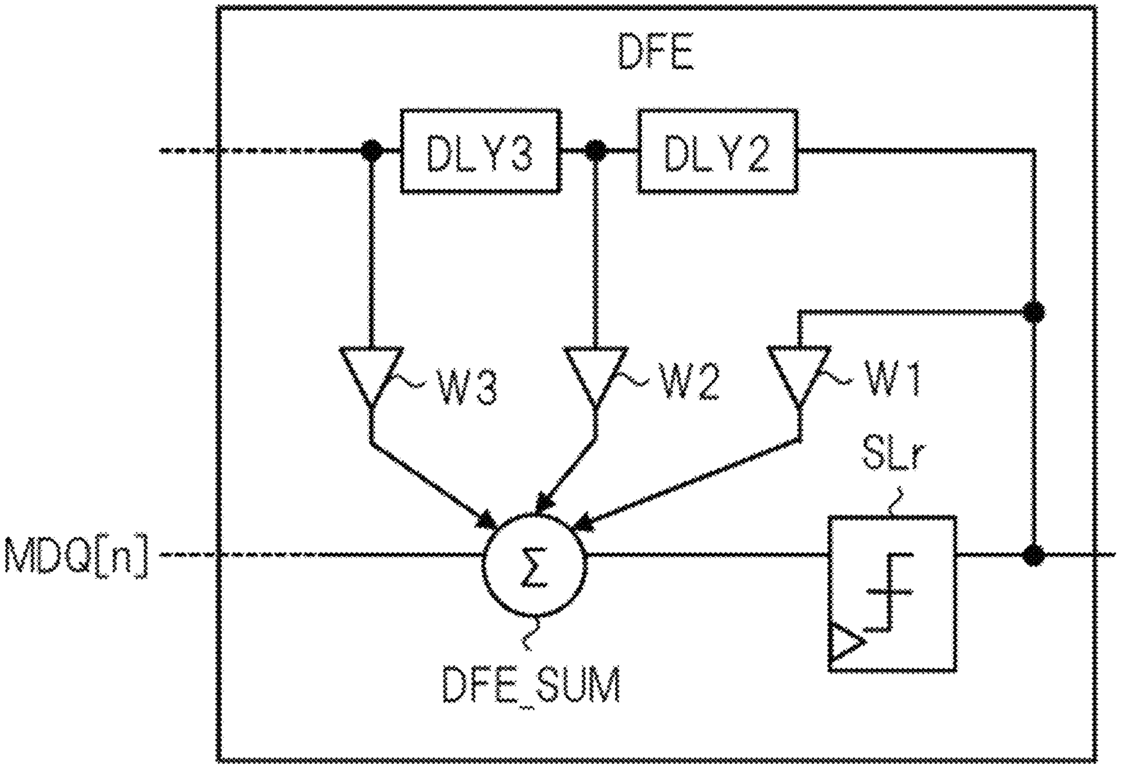
FIG. 5 is a circuit block diagram showing a configuration example of an adder/subtractor related to FIG. 3.

FIG. 3 is a circuit block diagram showing a schematic configuration example of the readout latch circuit RLTa related to the first embodiment in the data buffer DB shown in FIG. 2. FIG. 4 is a circuit block diagram showing a configuration example of the variable delay circuit VDLYs_A in FIG. 3. FIG. 5 is a circuit block diagram showing a configuration example related to the adder-subtractor DFE_SUM in FIG. 3.

The readout latch circuit RLTa shown in FIG. 3 includes, similarly to the case of FIG. 11A, receivers RXm_D, RXm_S, the main slicer (first data holding circuit) SLr, and the adder-subtractor DFE_SUM. In addition, the readout latch circuit RLTa includes a monitor slicer (second data holding circuit) SLr_M and a variable delay circuit VDLYs_A, which is different from the case of FIG. 11A.

Similarly to the case of FIG. 11A, the receivers RXm_D, RXm_S each input the data signal MDQ[n] and the data strobe signal MDQS from the memory chip MEM, respectively. Each of the receivers RXm_D, RXm_S is composed of a differential amplifier, and more specifically, a differential variable gain amplifier (VGA), as shown in detail in FIG. 2.

The main slicer (first data holding circuit) SLr latches the input data signal DQin transmitted from the memory chip MEM through the receiver RXm_D and the adder/subtractor DFE_SUM in synchronization with the main data strobe signal (first data strobe signal) DQSin. Meanwhile, the monitor slicer (second data holding circuit) SLr_M latches the input data signal DQin in synchronization with the monitor data strobe signal (second data strobe signal) DQSin_M.

The variable delay circuit VDLYs_A delays the input data strobe signal MDQS transmitted from the memory chip MEM through the receiver RXm_S by the main delay amount (first delay amount) ST1 and the monitor delay amount (second delay amount) ST2, respectively. Thus, the variable delay circuit VDLYs_A generates the main data strobe signal DQSin reflecting the main delay amount ST1 and the monitor data strobe signal DQSin_M reflecting the monitor delay amount ST2.

The variable delay circuit VDLYs_A, as shown in detail in FIG. 4, includes, for example, a series of connected delay elements DE[0]-DE[k] and selection circuits SEL1, SEL2. Each of the multiple delay elements DE[0]-DE[k] is composed of, for example, a two-stage CMOS inverter circuit or the like that realizes a delay of a unit delay time "dTof".

The selection circuit SEL1 selects one of the multiple outputs from the multiple delay elements DE[0]-DE[k] based on the main delay amount ST1 and outputs it as the main data strobe signal DQSin. Similarly, the selection circuit SEL2 selects one of the multiple outputs from the multiple delay elements DE[0]-DE[k] based on the monitor delay amount ST2 and outputs it as the monitor data strobe signal DQSin_M.

Returning to FIG. 3, the buffer control circuit CTRLa includes a timing adjustment circuit TMCT in addition to a delay-locked loop (DLL) similar to the case of FIG. 11A. The timing adjustment circuit TMCT has an exclusive OR circuit EOR and a search circuit SC. The exclusive OR circuit BOR is a data determination circuit that determines the match/mismatch between the data signal (first data signal) DQo from the main slicer SLr and the data signal (second data signal) DQo_M from the monitor slicer SLr_M. The exclusive OR circuit EOR outputs a monitor determination result MPF indicating match/mismatch, in other words, pass/fail.

The search circuit SC, in general, monitors the monitor determination result MPF while changing the monitor delay amount ST2 and adjusts the main delay amount ST1 based on the monitor determination result MPF. As a prerequisite for starting such adjustment, the initial value of the main delay amount ST1 before adjustment needs to be reasonably appropriate. That is, the initial value of the main delay amount ST1 must be at least such that the main slicer SLr can correctly latch the input data signal DQin. Therefore, the search circuit SC determines the initial value of the main delay amount ST1 by reflecting "(¼) Tck" from the Delay Locked Loop (DLL).

The adder/subtractor DFE_SUM is a component of the Decision Feedback Equalizer (DFE) and is inserted into the transmission path of the input data signal DQin. The Decision Feedback Equalizer (DFE) performs waveform equivalence of the input data signal DQin. Specifically, as shown in FIG. 5, the Decision Feedback Equalizer (DFE) comprises the adder/subtractor DFE_SUM and the main slicer SLr, in addition to, for example, a plurality of delay circuits DLY2, DLY3, . . . and a plurality of weighting circuits W1, W2, W3, . . . .

Each of the plurality of delay circuits DLY2, DLY3, . . . is composed of, for example, flip-flops similar to the slicer SLY, achieving a delay of one clock cycle. The weighting circuit W1 applies weighting, that is, multiplication, to the output of the slicer SLr. Similarly, the weighting circuits W2, W3, . . . apply weighting to the outputs of the delay circuits DLY2, DLY3, . . . , respectively. The adder/subtractor DFE_SUM adds or subtracts the outputs from the plurality of weighting circuits W1, W2, W3, . . . to the input data signal MDQ[n].

<Schematic Operation Related to the Read Latch Circuit (Embodiment)>

Figure 6:
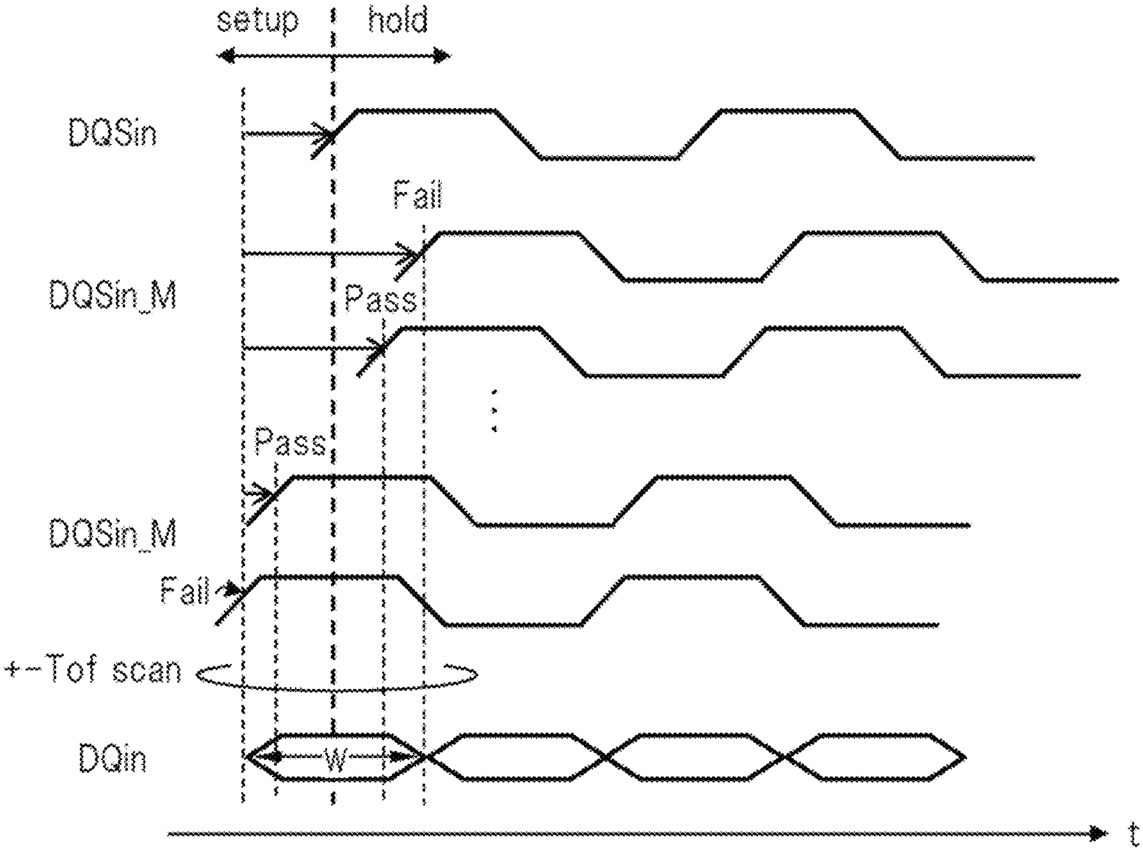
FIG. 6 is a timing chart showing a schematic operation example of the read latch circuit related to FIG. 3.

FIG. 6 is a timing chart showing an exemplary schematic operation related to the read latch circuit RLTa shown in FIG. 3. The timing adjustment circuit TMCT sequentially changes the monitor delay amount ST2 while keeping the main delay amount ST1 fixed. Thus, the edge timing of the monitor data strobe signal DQSin_M is scanned on the setup side and the hold side based on the edge timing of the main data strobe signal DQSin, as shown in FIG. 6.

Then, by sequentially changing the monitor delay amount ST2 in this manner and monitoring the monitor determination result MPF from the exclusive OR circuit EOR, the timing adjustment circuit TMCT can detect the eye width W of the input data signal DQin based on the edge timing at the point of change from pass (match) to fail (mismatch). The timing adjustment circuit TMCT adjusts the main delay amount ST1 so that the edge timing of the main data strobe signal DQSin is positioned in the center of the eye width W.

By using such a method, it is possible to correctly maintain the phase relationship between the data signal (input data signal DQin) and the data strobe signal (main data strobe signal DQSin) that determines the latch timing of the data signal. That is, the edge timing of the data strobe signal can be fixed in the center of the eye width W of the data signal.

Furthermore, by providing a monitor slicer SLr_M and scanning the monitor data strobe signal DQSin_M, it is possible to detect the eye width W of the input data signal DQin without affecting the normal read operation in the memory chip MEM. That is, while transmitting the data signal DQo from the main slicer SLr as the read data signal from the memory chip MEM to the data external terminals PNdA, PNdB in the subsequent stage, as shown in FIG. 1, the eye width W of the input data signal DQin can be detected in the background.

Accordingly, for example, during the period of normal reading operation, even if the environment such as temperature and voltage changes, and hence, the delay time of the transmission path changes due to a Decision Feedback Equalizer (DFE) or the like, it is possible to optimize the strobe timing while following the changes in real-time. As a result, a system robust to changes in the environment can be realized. Furthermore, for example, there is no need to interrupt the normal reading operation to retrain the strobe timing, etc. As a result, the operating time of the system can be secured.

Moreover, since it is possible to compensate for changes in the delay time of the transmission path according to changes in the environment, circuits with temperature dependency, such as a Decision Feedback Equalizer (DFE), can be easily mounted within the transmission path. By mounting a Decision Feedback Equalizer (DFE), it is possible to achieve higher data transfer speeds, lower power consumption as mentioned in FIG. 11A, or both. It should be noted that, although the example described here involves inserting a Decision Feedback Equalizer (DFE) into the data signal transmission path, the circuit to be inserted is not limited to this and may be another circuit with temperature dependency.

<Details of Buffer Control Circuit (Timing Adjustment Circuit)>

Figure 7A:
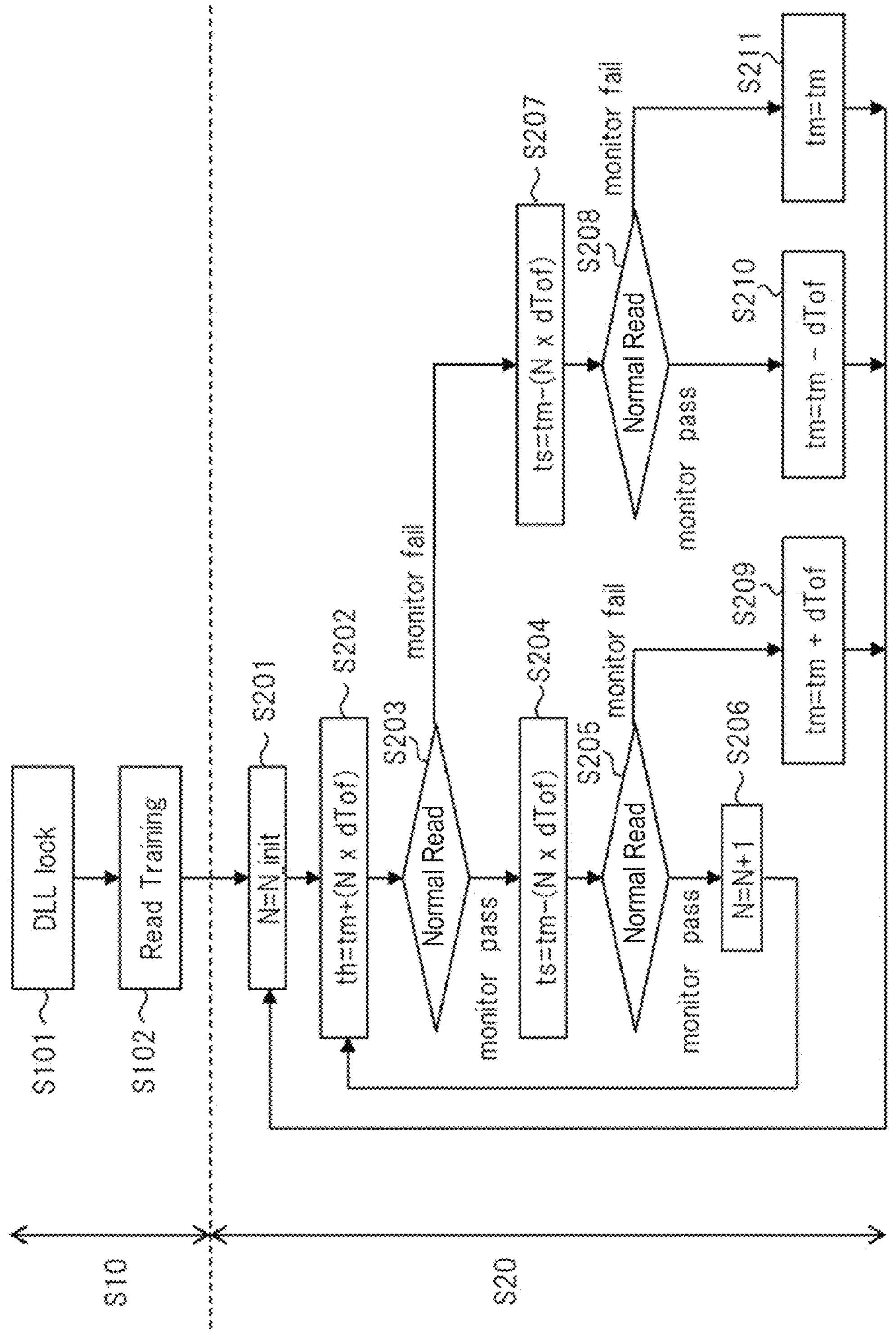
FIG. 7A is a flowchart showing an example of the processing content of a buffer control circuit shown in FIG. 3.
Figure 7B:
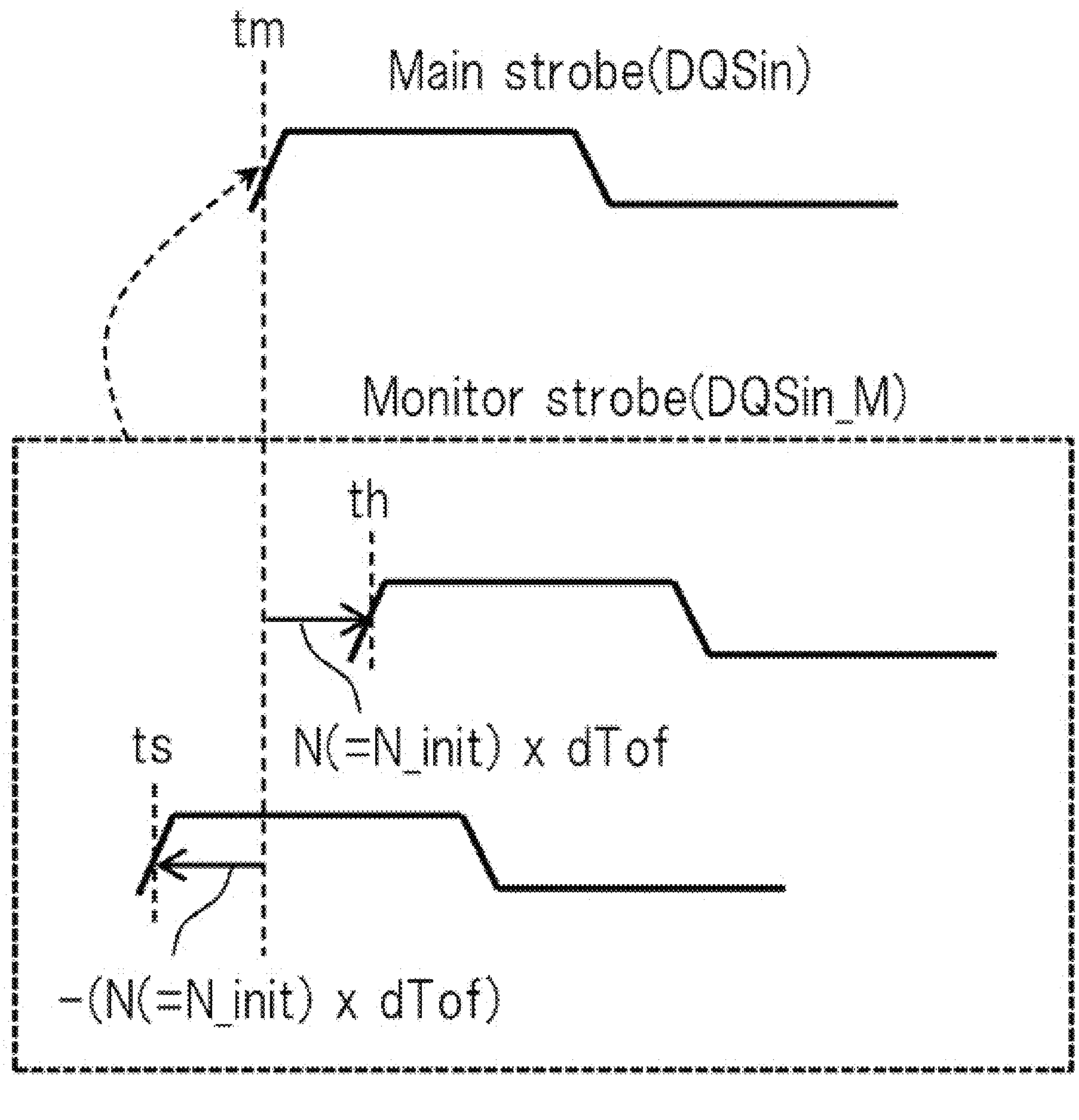
FIG. 7B is a supplementary diagram for explaining the flowchart shown in FIG. 7A.
Figure 7C:
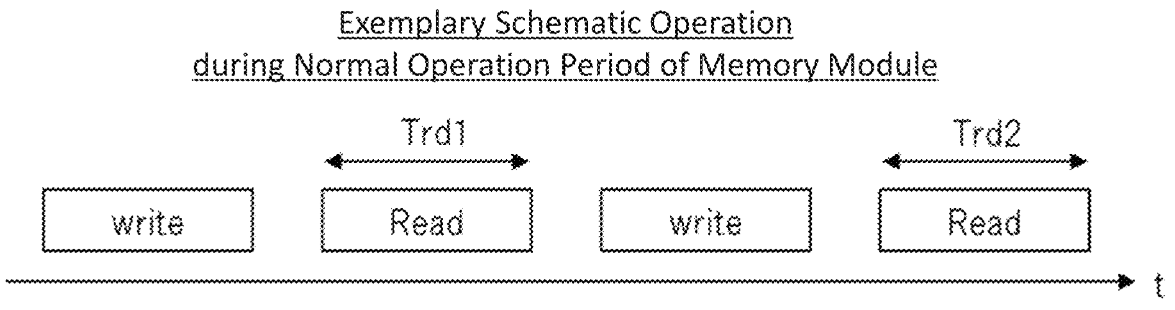
FIG. 7C is a supplementary diagram for explaining the flowchart shown in FIG. 7A.

FIG. 7A is a flowchart showing an example of the processing content of the buffer control circuit CTRLa shown in FIG. 3. FIGS. 7B and 7C are supplementary diagrams for explaining the flowchart shown in FIG. 7A. FIG. 7A shows the processing content during the initial sequence period (Step S10) and the processing content during the subsequent normal operation period (Step S20). These processes are mainly executed by the timing adjustment circuit TMCT. The timing adjustment circuit TMCT is composed of a sequencer or the like that executes processing as shown in FIG. 7A.

In the initial sequence period (Step S10), first, the Delay Locked Loop (DLL) becomes locked (Step S101). That is, as described in FIGS. 10A and 10B, the phase comparison result by the Phase Comparator PHD converges, and as a result, the decoder QDEC outputs a delay amount of "(¼) Tck". Subsequently, the buffer control circuit CTRLa executes read training using a generally known training circuit during the training period of the memory chip MEM (Step S102).

Through read training, for example, as shown in FIGS. 11A and 11B, a delay amount of the variable delay circuit where "td_dq=td_dqs" is searched. The timing adjustment circuit TMCT in FIG. 3 determines the initial value of the main delay amount ST1 by adding the delay amount of "(¼) Tck" from the decoder QDEC to the delay amount obtained during the read training. Thus, for example, a state as shown in the typical case (typ) in FIG. 11B is constructed.

In the subsequent normal operation period (step S20), the timing adjustment circuit TMCT starts its operation by setting the main delay amount ST1 from the state determined by the initial value obtained during the initial sequence period (step S10). In step S20, in summary, the following processes are executed.

First, as shown in FIG. 7B, the timing adjustment circuit TMCT generates respective monitor delay amounts ST2 for obtaining the edge timings th, ts of the monitor data strobe signal DQSin_M, based on the edge timing tm of the main data strobe signal DQSin. The edge timings th, ts are timings shifted by "N times dTof" ("N×dTof") on both the hold and setup sides from the edge timing tm. Initially, "N" is determined to be the initial value "N_init" (step S201).

The timing adjustment circuit TMCT judges pass/fail based on the monitor judgment result MPF with the edge timing of the monitor data strobe signal DQSin_M set to one of the edge timings th, ts, and then, with it set to the other, judges pass/fail based on the monitor judgment result MPF. Then, as long as the monitor judgment result MPF is a pass, the timing adjustment circuit TMCT sequentially increases the integer "N", thereby gradually expanding the shift width of the edge timings th, ts based on the edge timing tm (steps S202-S206).

Here, the monitor judgment results MPF in steps S203, S205 are obtained using the normal read operation for the memory chip MEM. That is, as shown in FIG. 7C, during the normal operation period of the memory module MDL, and thus the memory chip MEM, write cycles and read cycles Trd1, Trd2 are appropriately included. The buffer control circuit CTRLa, and thus the timing adjustment circuit TMCT, can identify the data read period within the read cycles Trd1, Trd2 based on the buffer control signal from the BCOM bus BS_BCOM, as described in FIG. 2.

Thus, for example, the timing adjustment circuit TMCT obtains the monitor judgment result MPF at the hold side edge timing th during the data read period within the read cycle Trd1 in step S203. Subsequently, the timing adjustment circuit TMCT obtains the monitor judgment result MPF at the setup side edge timing ts during the data read period within the read cycle Trd2 in step S205.

On the other hand, if the shift width of the edge timings th, ts is sequentially expanded, at a certain point, a failure occurs at least on one of the edge timings th, ts. First, assume the case where a failure occurs at the hold side edge timing th, and also a failure occurs at the setup side edge timing ts (steps S202, S203, S207, S208, S211). This state indicates that the main edge timing tm is positioned in the center of the eye width W of the input data signal DQin. Therefore, the timing adjustment circuit TMCT maintains the main edge timing tm, that is, the main delay amount ST1 as it is (step S211), and returns to the state shown in FIG. 7B corresponding to step S201.

Next, assume a case where a failure occurs at the hold side edge timing th, and a pass occurs at the setup side edge timing ts (steps S202, S203, S207, S208, S210). This state indicates that the main edge timing tm is located on the hold side rather than the center of the eye width W. Therefore, the timing adjustment circuit TMCT shifts the main edge timing tm by a unit delay time "dTof" in the setup direction, that is, in the direction of delay reduction (step S210), and returns to step S201.

Finally, assume a case where a pass occurs at the hold side edge timing th, and a failure occurs at the setup side edge timing ts (steps S202, S203, 3204, S205, S209). This state indicates that the main edge timing tm is located on the setup side rather than the center of the eye width W. Therefore, the timing adjustment circuit TMCT shifts the main edge timing tm by a unit delay time "dTof" in the hold direction, that is, in the direction of delay increase (step S209), and returns to step S201.

For example, by using such a flowchart, during the normal operation period (step S20), the edge timing tm of the main data strobe signal DQSin can be fixed to the center of the eye width W of the input data signal DQin. And thus, by optimizing the main delay amount ST1 during the normal operation period (step S20), for example, during the initial sequence period (S10), it is not necessarily required to precisely determine the initial value of the main delay amount ST, specifically, the main delay amount ST1. As a result, for example, the delay-locked loop (DLL) can be simplified, and also, the time required to lock the delay-locked loop (DLL), that is, the time required for processing in step S101, can be shortened.

<Regarding Various Supplementary Matters>

In DDR-SDRAM chips, more specifically, multiple data signals MDQ are assigned to a single data strobe signal MDQS. In this case, the timing adjustment circuit TMCT may, for example, execute processing as shown in FIG. 7A, targeting a representative one of the multiple data signals MDQ selected from among them.

Alternatively, the timing adjustment circuit TMCT may execute processing as shown in FIG. 7A, targeting multiple data signals MDQ. In this case, multiple monitor determination results MPF targeting the multiple data signals MDQ can be obtained simultaneously on both the hold side and the setup side. The timing adjustment circuit TMCT may, for example, execute processing as shown in FIG. 7A, considering the entire set as a failure if there is one or more fails among the multiple monitor determination results MPF.

Furthermore, for example, in FIG. 7C, each of the read cycles Trd1, Trd2 may include multiple data signals MDQ in a time series due to burst reading, etc. In this case, the timing adjustment circuit TMCT may, for example, obtain multiple monitor determination results MPF for the multiple data signals MDQ, and if there is one or more fails among them, consider the entire set as a failure and execute processing as shown in FIG. 7A.

Note that the application of the configuration of the read latch circuit RLTa and the buffer control circuit CTRLa shown in FIG. 3 is not necessarily limited to memory modules MDL. That is, the configuration may, for example, also be applied to semiconductor chips such as SoCs constituting a host, in memory interface circuits mounted on the semiconductor chips.

<Main Effects of the First Embodiment>

As described above, in the method of the first embodiment, a monitor slicer SLr_M is provided, and using this monitor slicer SLr_M, the phase of the data strobe signal DQSin to the main slicer SLr is adjusted to the optimal value. This allows, typically, the phase relationship between the data signal and the data strobe signal to be correctly maintained. Especially, even when the environment changes, such as temperature and voltage, during the normal operation period, the phase of the data strobe signal can be adjusted in real-time in the background without retraining.

Second Embodiment

<Configuration and Operation Related to Read Latch Circuit (Embodiment)>

Figure 8:
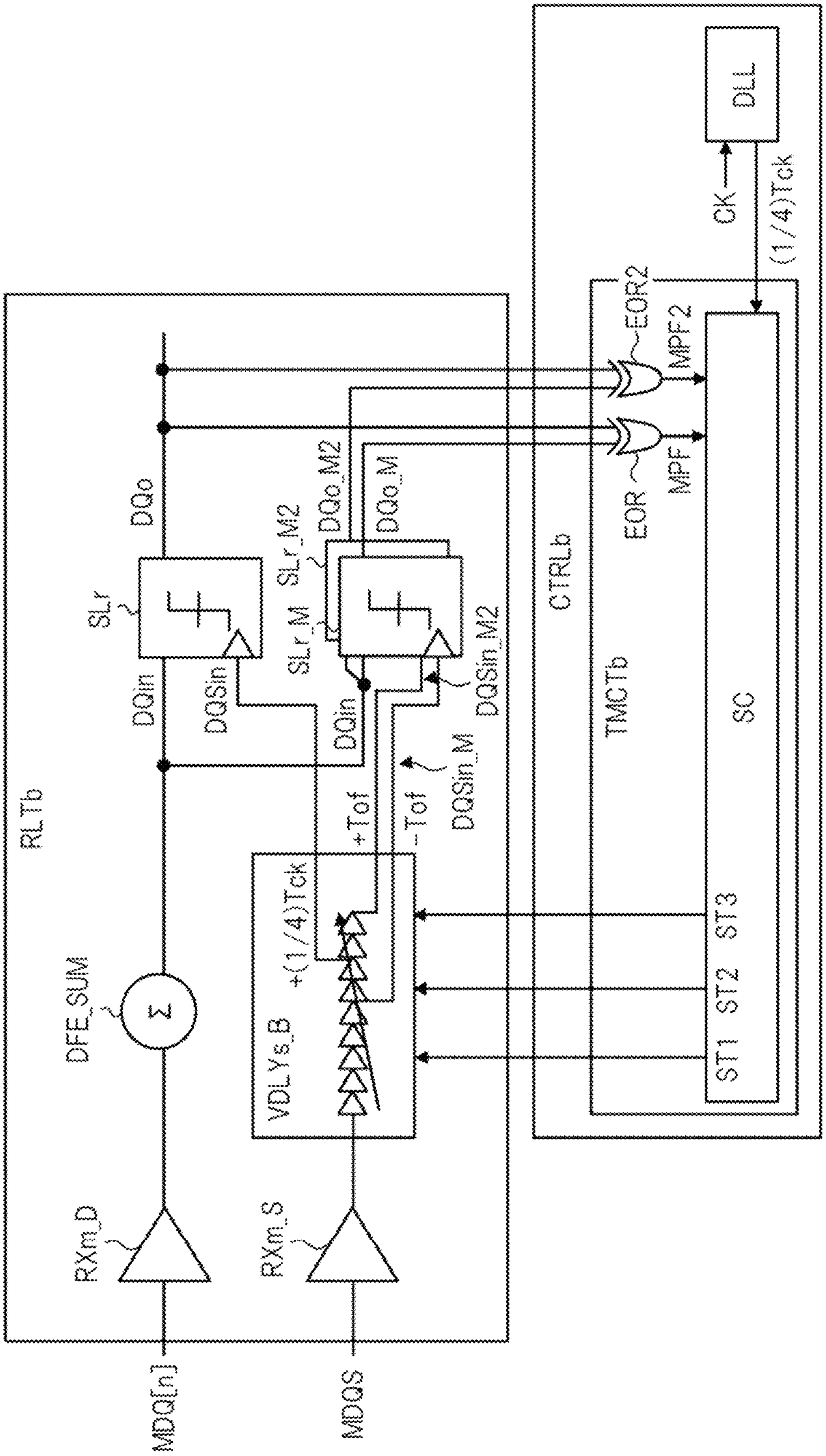
FIG. 8 is a circuit block diagram showing a schematic configuration example of a read latch circuit related to the data buffer shown in FIG. 2 in a semiconductor device according to a second embodiment.

FIG. 8 is a circuit block diagram showing a schematic configuration example related to the read latch circuit RLTb in the data buffer DB shown in FIG. 2, in a semiconductor device according to the second embodiment. The read latch circuit RLTb shown in FIG. 8, unlike the read latch circuit RLTa shown in FIG. 3, includes a monitor slicer (second data holding circuit) SLr_M, and further includes another monitor slicer (third data holding circuit) SLr_M2. The monitor slicer SLr_M2, like the monitor slicer SLr_M, latches the input data signal DQin in synchronization with the monitor data strobe signal (third data strobe signal).

As a result of such a difference in configuration, the read latch circuit RLTb includes a variable delay circuit VDLYs_B, which is an expanded version of the variable delay circuit VDLYs_A shown in FIGS. 3 and 4. That is, the variable delay circuit VDLYs_B generates a monitor data strobe signal DQSin_M by delaying the input data strobe signal MDQS with a monitor delay amount ST2, which is smaller than the main delay amount ST1. Furthermore, the variable delay circuit VDLYs_B generates a monitor data strobe signal DQSin_M2 by delaying the input data strobe signal MDQS with a monitor delay amount ST3, which is larger than the main delay amount ST1.

Figure 9:
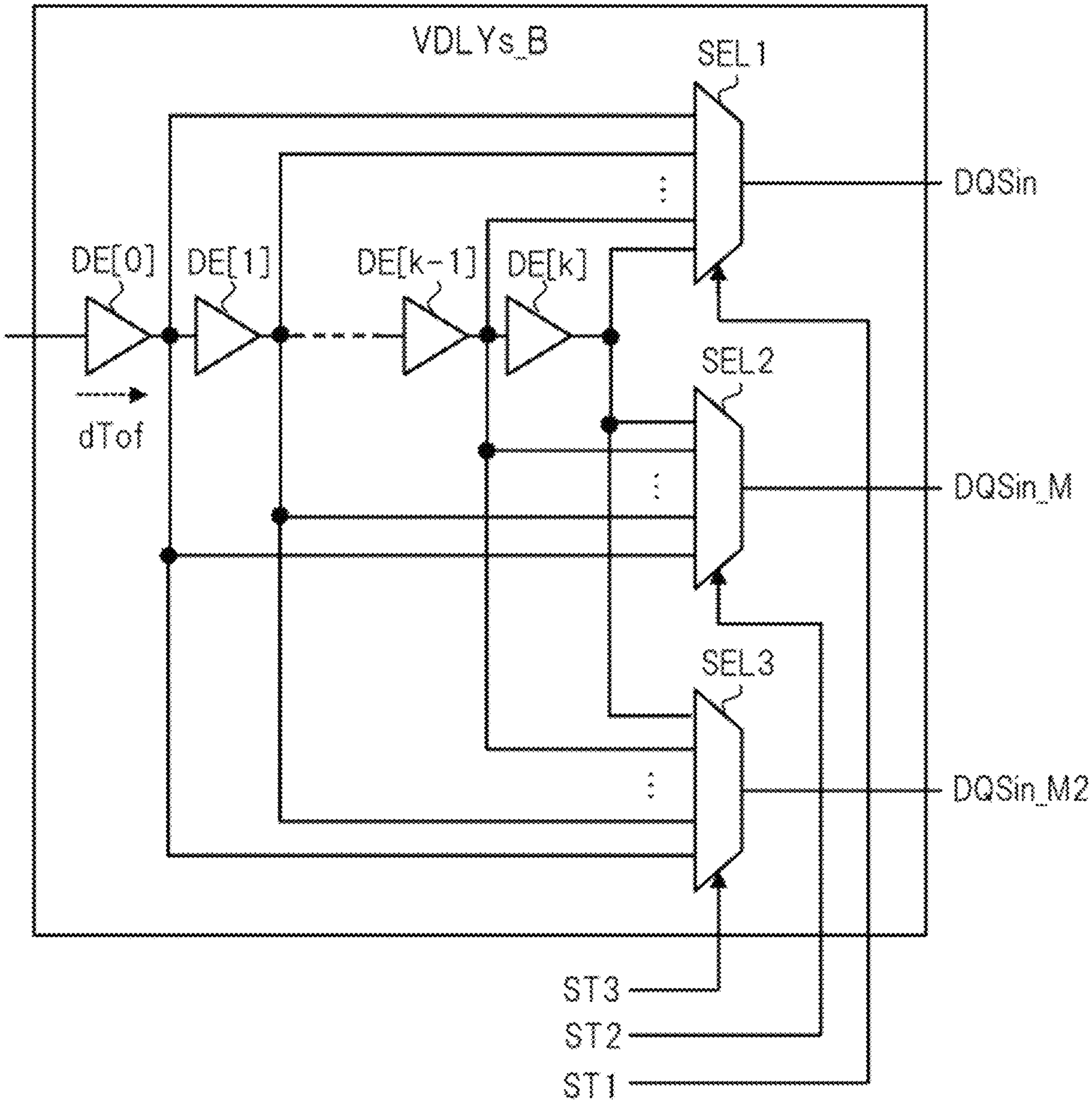
FIG. 9 is a circuit block diagram showing a configuration example of a variable delay circuit in FIG. 8.

FIG. 9 is a circuit block diagram showing a configuration example of the variable delay circuit VDLYs_B in FIG. 8. The variable delay circuit VDLYs_B shown in FIG. 9 further includes a selection circuit SEL3, in addition to the configuration example shown in FIG. 4. The selection circuit SEL3, like the selection circuits SEL1, SEL2, selects one of the multiple outputs from multiple delay elements DE[0]-DE[k] based on the monitor delay amount ST3 and outputs it as the monitor data strobe signal DQSin_M2.

Returning FIG. 8, the buffer control circuit CTRLb includes a timing adjustment circuit TMCTb, which is an expanded version of the timing adjustment circuit TMCT shown in FIG. 3. The timing adjustment circuit TMCTb includes another exclusive OR circuit EOR2, in addition to the exclusive OR circuit BOR shown in FIG. 3. The exclusive OR circuit EOR2 determines the match/mismatch between the data signal (first data signal) DQo from the main slicer SLr and the data signal (third data signal) DQo_M2 from the monitor slicer SLr_M2. Then, the exclusive OR circuit EOR2 outputs a monitor determination result MPF2, which represents match/mismatch, in other words, pass/fail.

On the other hand, the search circuit SC, similarly to the case shown in FIG. 3, uses an exclusive OR circuit EOR to determine the match/mismatch between the data signal DQo from the main slicer SLr and the data signal DQo_M from the monitor slicer SLr_M while changing the monitor delay amount ST2. Additionally, the search circuit SC uses an exclusive OR circuit EOR2 to determine the match/mismatch between the data signal DQo from the main slicer SLr and the data signal DQo_M2 from the monitor slicer SLr_M2 while also changing the monitor delay amount ST3. Then, the search circuit SC adjusts the main delay amount ST1 based on these monitor determination results MPF, MPF2.

By using such a configuration, it is possible to further improve the real-time performance when optimizing the main delay amount ST1 according to changes in the environment such as temperature and voltage. That is, in the examples shown in FIGS. 7A, 7B, and 7C described above, the monitor determination result MPF at the hold side edge timing th was obtained in a certain read cycle, and then the monitor determination result MPF at the setup side edge timing ts was obtained in the next read cycle. Using the configuration example shown in FIG. 8, it is possible to simultaneously obtain the monitor determination result MPF2 at the hold side edge timing th and the monitor determination result MPF at the setup side edge timing ts in a single read cycle.

Main Effects of the Second Embodiment

As described above, by using the method of the second embodiment, it is possible to achieve effects similar to those described in the first embodiment. Furthermore, compared to the method of the first embodiment, although there is a slight increase in circuit area overhead, it is possible to further improve the real-time performance when optimizing the phase of the data strobe signal according to changes in the environment. As a result, a more robust system can be realized against changes in the environment.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
- a first data holding circuit for latching an input data signal in synchronization with a first data strobe signal;
- a second data holding circuit for latching the input data signal in synchronization with a second data strobe signal;
- a variable delay circuit for generating the first and second data strobe signals by delaying an input data strobe signal by a first delay amount and a second delay amount, respectively; and
- a timing adjustment circuit for setting the first and second delay amounts in the variable delay circuit,
- wherein the timing adjustment circuit adjusts the first delay amount based on a determination of a match/mismatch between a first data signal from the first data holding circuit and a second data signal from the second data holding circuit while changing the second delay amount,
- wherein the input data signal and the input data strobe signal are signals output from a memory chip,
- wherein the timing adjustment circuit operates during a normal operation period in which the memory chip performs a normal read operation, and
- wherein the first data signal is transmitted to a subsequent stage as a read data signal from the memory chip.

2. The semiconductor device according to claim 1, wherein the memory chip is a DDR-SDRAM chip.

3. The semiconductor device according to claim 1,
- wherein an initial sequence period including a training period for the memory chip is provided before the normal operation period,
- wherein the initial value of the first delay amount is determined during the initial sequence period, and
- wherein the timing adjustment circuit starts operating from the initial value of the first delay amount during the normal operation period.

4. The semiconductor device according to claim 1, wherein the timing adjustment circuit detects the eye width of the input data signal by determining the match/mismatch while changing the second delay amount and adjusts the first delay amount so that the edge of the first data strobe signal is positioned in the center of the eye width.

5. The semiconductor device according to claim 1, further comprising a Decision Feedback Equalizer (DFE) inserted in the transmission path of the input data signal for performing waveform equivalence of the input data signal, semiconductor device.

6. A semiconductor device according to claim 1, further comprising:
- a third data holding circuit for latching the input data signal in synchronization with a third data strobe signal,
- wherein the variable delay circuit generates the second data strobe signal by delaying the input data strobe signal by a second delay amount smaller than the first delay amount,
- wherein the variable delay circuit generates the third data strobe signal by delaying the input data strobe signal by a third delay amount larger than the first delay amount, and
- wherein the timing adjustment circuit adjusts the first delay amount based on the determination of the match/mismatch between the first data signal and the second data signal and the match/mismatch between the first data signal and the third data signal from the third data holding circuit, while varying the second and third delay amounts.

7. The semiconductor device according to claim 1, wherein the semiconductor device is a semiconductor chip that serves the function of a data buffer in a memory module.

8. A memory module comprising:
- a module wiring board having control external terminals and data external terminals;
- multiple DDR-SDRAM chips mounted on the module wiring board;
- a registered clock driver mounted on the module wiring board for re-driving a memory control signal input through the control external terminals and outputting to the multiple DDR-SDRAM chips; and
- a data buffer mounted on the module wiring board for re-driving data signals and data strobe signals input through the data external terminals and outputting to the multiple DDR-SDRAM chips, and for re-driving input data signals and input data strobe signals from the multiple DDR-SDRAM chips and outputting to the data external terminals,
- wherein the data buffer has a first data holding circuit for latching the input data signal in synchronization with a first data strobe signal, a second data holding circuit for latching the input data signal in synchronization with a second data strobe signal, a variable delay circuit for generating the first and second data strobe signals by delaying the input data strobe signal by the first and second delay amounts, respectively, and a timing adjustment circuit for setting the first and second delay amounts in the variable delay circuit, and wherein the timing adjustment circuit adjusts the first delay amount based on the determination of whether the first data signal from the first data holding circuit matches or does not match the second data signal from the second data holding circuit, while varying the second delay amount.

9. The memory module according to claim 8, wherein the timing adjustment circuit operates during a normal operation period in which the plurality of DDR-SDRAM chips perform normal read operations, and wherein the first data signal is transmitted to the external terminal for data as the read data signal from the plurality of DDR-SDRAM chips.

10. A memory module according to claim 9, wherein an initial sequence period including a training period for the plurality of DDR-SDRAM chips is provided before the normal operation period, wherein the initial value of the first delay amount is determined during the initial sequence period, and wherein the timing adjustment circuit starts operating from the state where the first delay amount is set to the initial value during the normal operation period.

11. The memory module according to claim 8, wherein the timing adjustment circuit detects the eye width of the input data signal by determining the match/mismatch while changing the second delay amount, and adjusts the first delay amount so that the edge of the first data strobe signal is positioned in the center of the eye width.

12. The memory module according to claim 8, wherein the data buffer further includes a Decision Feedback Equalizer (DFE) that is inserted in the transmission path of the input data signal and performs waveform equalization of the input data signal.

13. The memory module according to claim 8, wherein the data buffer further includes a third data holding circuit that latches the input data signal in synchronization with a third data strobe signal, wherein the variable delay circuit generates the second data strobe signal by delaying the input data strobe signal with a second delay amount smaller than the first delay amount, and generates the third data strobe signal by delaying with a third delay amount larger than the first delay amount, and wherein the timing adjustment circuit adjusts the first delay amount based on the determination of the match/mismatch between the first data signal and the second data signal, and the match/mismatch between the first data signal and the third data signal from the third data holding circuit, while changing the second and third delay amounts.

* * * * *